United States Patent
Hong et al.

(10) Patent No.: US 7,696,563 B2
(45) Date of Patent: Apr. 13, 2010

(54) NON-VOLATILE MEMORY DEVICE AND METHOD OF MANUFACTURING THE SAME

(75) Inventors: Sug-Hun Hong, Yongin-si (KR); Myoung-Bum Lee, Seoul (KR); Gab-Jin Nam, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 163 days.

(21) Appl. No.: 11/896,834

(22) Filed: Sep. 6, 2007

(65) Prior Publication Data
US 2008/0067581 A1 Mar. 20, 2008

(30) Foreign Application Priority Data
Sep. 11, 2006 (KR) .................. 10-2006-0087259

(51) Int. Cl.
*H01L 29/792* (2006.01)
*H01L 21/336* (2006.01)
(52) U.S. Cl. .............. 257/324; 257/E29.309; 257/E21.423; 438/287
(58) Field of Classification Search .......... 257/314, 257/324, 315, 316, 321, E29.3, E29.304, 257/E29.17, E29.309, E21.423; 438/287, 438/201, 197
See application file for complete search history.

(56) References Cited

U.S. PATENT DOCUMENTS

| | | | |
|---|---|---|---|
| 6,011,289 A | 1/2000 | Huang et al. | |
| 6,774,442 B2 * | 8/2004 | Hayashi et al. | 257/412 |
| 6,806,532 B2 * | 10/2004 | Kobayashi | 257/324 |
| 7,208,793 B2 * | 4/2007 | Bhattacharyya | 257/314 |
| 7,230,294 B2 | 6/2007 | Lee et al. | |
| 2004/0113213 A1 * | 6/2004 | Maekawa | 257/411 |
| 2006/0033152 A1 | 2/2006 | Kim et al. | |
| 2006/0118858 A1 * | 6/2006 | Jeon et al. | 257/321 |

FOREIGN PATENT DOCUMENTS

| | | |
|---|---|---|
| KR | 10-2006-0015373 | 2/2006 |
| KR | 10-0578131 | 5/2006 |

\* cited by examiner

*Primary Examiner*—Victor A Mandala
*Assistant Examiner*—Scott Stowe
(74) *Attorney, Agent, or Firm*—Lee & Morse, P.C.

(57) ABSTRACT

A non-volatile memory device includes a tunnel insulating layer pattern on a channel region of a substrate, a charge trapping layer pattern on the tunnel insulating layer pattern, a blocking layer pattern on the charge trapping layer pattern, and a gate electrode including a conductive layer pattern on the blocking layer pattern and a barrier layer pattern on the conductive layer pattern. The conductive layer pattern includes a metal.

16 Claims, 4 Drawing Sheets

NON-VOLATILE MEMORY DEVICE AND METHOD OF MANUFACTURING THE SAME

BACKGROUND OF THE INVENTION

1. Field of the Invention

Embodiments relate to a non-volatile memory device and a method of manufacturing the same and, more particularly, to a non-volatile memory device including a conductive layer and a barrier layer, and a method of manufacturing the same.

2. Description of the Related Art

A silicon oxide nitride oxide semiconductor (SONOS) or metal oxide nitride oxide semiconductor (MONOS) type non-volatile memory device may include a tunnel insulating layer formed on a channel region of a semiconductor substrate, a charge trapping layer for trapping electrons from the channel region, a blocking layer formed on the charge trapping layer, a gate electrode formed on the blocking layer, and source/drain regions formed at surface portions of the semiconductor substrate adjacent to the channel region.

The conventional non-volatile memory device may serve as a single level cell (SLC) or a multi-level cell (MLC), and may perform programming and erasing using a Fowler-Nordheim (F-N) tunneling mechanism and/or a channel hot electron injection mechanism.

For example, a programming voltage, e.g., about 5 V to about 18 V, may be applied to the gate electrode and electrons may be trapped in trap sites of the charge trapping layer from the channel region of the semiconductor substrate by F-N tunneling. Thus, a logic state, e.g., "1," may be stored in the charge trapping layer. A threshold voltage in the channel region may be varied by the electrons trapped in the charge trapping layer, and the logic state may be read by applying reading voltages different from each other to the gate electrode and a drain region, and then detecting a current in the channel region.

The erasing operation of the non-volatile memory device may be performed by applying an erasing voltage, e.g., about −15 V to about −20 V, to the gate electrode. However, when the erasing voltage is applied to the gate electrode, a back-tunneling may occur, i.e., a phenomenon whereby electrons move from the gate electrode to the charge trapping layer through the blocking layer. Consequently, the time required for the erasing operation may be increased, and the data retention performance and operating reliability of the non-volatile memory device may be degraded.

One approach to ameliorating the above-described problems is to form the gate electrode using a material having a relatively high work function, such as metal nitride, metal oxide, etc. However, the work function of the gate electrode may subsequently be altered or varied during a later-applied heat treatment process. For example, after forming the gate electrode using metal nitride or metal oxide, the work function of the gate electrode may be undesirably varied during a heat treatment process for activating impurities (dopants) implanted in the source/drain regions. Consequently, there is a need for non-volatile memory device, and a method of making the same, wherein the back-tunneling of electrons through the blocking layer may be reduced or prevented.

SUMMARY OF THE INVENTION

Embodiments are therefore directed to a non-volatile memory device and a method of manufacturing the same, which substantially overcome one or more of the problems due to the limitations and disadvantages of the related art.

It is therefore a feature of an embodiment to provide a non-volatile memory device including a conductive layer and a barrier layer.

It is therefore another feature of an embodiment to provide a method of manufacturing a non-volatile memory device in which a barrier layer is formed on a conductive layer, the barrier layer reducing the effects of heat treatment on the conductive layer.

At least one of the above and other features and advantages may be realized by providing a non-volatile memory device, including a tunnel insulating layer pattern on a channel region of a substrate, a charge trapping layer pattern on the tunnel insulating layer pattern, a blocking layer pattern on the charge trapping layer pattern, and a gate electrode including a conductive layer pattern on the blocking layer pattern and a barrier layer pattern on the conductive layer pattern. The conductive layer pattern includes a metal.

The barrier layer pattern may include metal silicon nitride. The barrier layer pattern may include one or more of titanium silicon nitride, tungsten silicon nitride, or tantalum silicon nitride. The conductive layer pattern may include a material having a work function of about 4 eV or more. The conductive layer pattern may include one or more of titanium, titanium nitride, tantalum, tantalum nitride, tungsten, tungsten nitride, hafnium, niobium, molybdenum, molybdenum nitride, ruthenium oxide, ruthenium dioxide, iridium, iridium dioxide, platinum, cobalt, chromium, titanium aluminide, titanium aluminum nitride, palladium, tungsten silicide, nickel silicide, cobalt silicide, or tantalum silicide.

The non-volatile memory device may further include source/drain regions in the substrate adjacent to the channel region. The source/drain regions may be activated impurity regions. The non-volatile memory device may further include a word line disposed on the gate electrode. The word line may include polysilicon containing activated impurities.

A thickness of the barrier layer pattern may be less than that of the conductive layer pattern. A thickness ratio of the barrier layer pattern to the conductive layer pattern may be about 3:10 to about 7:10.

At least one of the above and other features and advantages may also be realized by providing a method of manufacturing a non-volatile memory device, including forming a tunnel insulating layer pattern on a channel region of a substrate, forming a charge trapping layer pattern on the tunnel insulating layer, forming a blocking layer pattern on the charge trapping layer, and forming a gate electrode, the gate electrode including a conductive layer pattern on the blocking layer, the conductive layer pattern including a metal, and a barrier layer pattern on the conductive layer pattern.

The barrier layer pattern may include metal silicon nitride. The barrier layer pattern may include one or more of titanium silicon nitride, tungsten silicon nitride, or tantalum silicon nitride. The conductive layer pattern may include a material having a work function of about 4 eV or more. The conductive layer pattern may include one or more of titanium, titanium nitride, tantalum, tantalum nitride, tungsten, tungsten nitride, hafnium, niobium, molybdenum, molybdenum nitride, ruthenium oxide, ruthenium dioxide, iridium, iridium dioxide, platinum, cobalt, chromium, titanium aluminide, titanium aluminum nitride, palladium, tungsten silicide, nickel silicide, cobalt silicide, or tantalum silicide.

The method may further include forming source/drain regions in the substrate adjacent to the channel region. Forming the source/drain regions may include activating impurity regions using a heat treatment.

The method may further include forming a word line on the gate electrode. Forming the word line may include implanting impurities in a polysilicon layer and heat treating the implanted polysilicon layer.

A thickness of the barrier layer pattern may be less than that of the conductive layer pattern. A thickness ratio of the barrier layer pattern to the conductive layer pattern may be about 3:10 to about 7:10. The method may further include heat treating the gate electrode.

BRIEF DESCRIPTION OF THE DRAWINGS

The above and other features and advantages will become more apparent to those of ordinary skill in the art by describing in detail example embodiments with reference to the attached drawings, in which.

DESCRIPTION OF THE INVENTION

Figure 1:
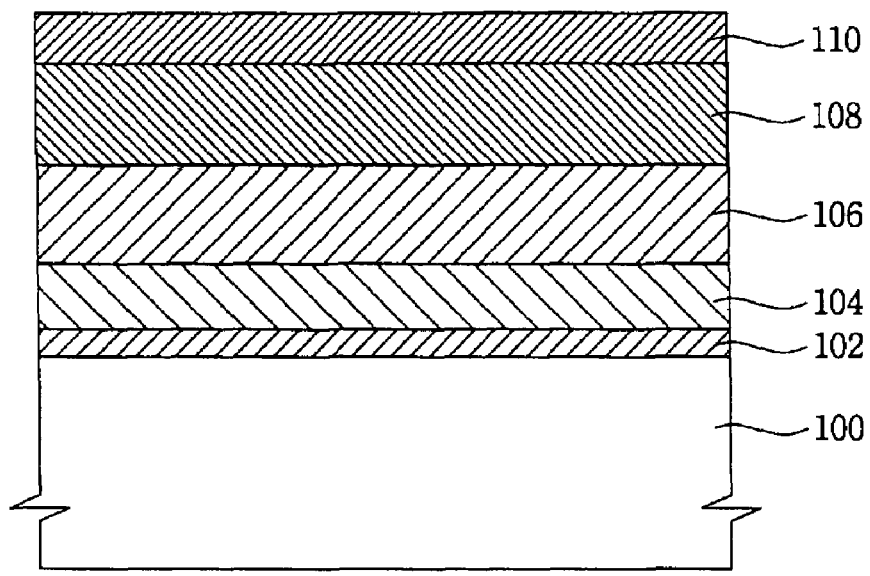
FIGS. 1 to 6 illustrate cross-sectional views of stages in a method of manufacturing a non-volatile memory device according to an example embodiment.

Korean Patent Application No. 2006-87259, filed on Sep. 11, 2006, in the Korean Intellectual Property Office, and entitled: "Non-Volatile Memory Device and Method of Manufacturing the Same," is incorporated by reference herein in its entirety.

Example embodiments will now be described more fully hereinafter with reference to the accompanying drawings; however, they may be embodied in different forms and should not be construed as limited to the embodiments set forth herein.

Rather, these embodiments are provided so that this disclosure will be thorough and complete, and will fully convey the scope of the invention to those skilled in the art. In the figures, the dimensions of layers and regions may be exaggerated for clarity of illustration. Like reference numerals refer to like elements throughout.

In accordance with the example embodiments described herein, a variation in the work function of a conductive layer may be reduced by a barrier layer. Thus, back-tunneling of electrons through the blocking layer pattern may be reduced, which may reduce a time required to erase data from the non-volatile memory device.

FIGS. 1 to 6 illustrate cross-sectional views of stages in a method of manufacturing a non-volatile memory device in accordance with an example embodiment.

Referring to FIG. 1, an active region may be defined in a surface portion of a semiconductor substrate 100, e.g., a silicon wafer, using an isolation layer (not shown). For example, the isolation layer may be formed in the surface portion of the semiconductor substrate 100 by a local oxidation of silicon (LOCOS) process or a shallow trench isolation (STI) process.

A tunnel insulating layer 102, a charge trapping layer 104, a blocking layer 106, a first conductive layer 108 and a barrier layer 110 may be formed sequentially on the semiconductor substrate 100. The tunnel insulating layer 102 may include, e.g., silicon oxide ($SiO_2$), and may be formed to a thickness of, e.g., about 20 Å to about 80 Å. For example, the tunnel insulating layer 102 may be formed to a thickness of about 35 Å on the semiconductor substrate 100. The tunnel insulating layer 102 may be formed using, e.g., a thermal oxidation process.

The charge trapping layer 104 may be provided to trap electrons from a channel region of the semiconductor substrate 100 during operation of the memory device. The charge trapping layer 104 may include, e.g., silicon nitride, and may be formed, e.g., to a thickness of about 20 Å to about 120 Å, on the tunnel insulating layer 102. For example, the charge trapping layer 104 may be formed to a thickness of about 70 Å using, e.g., a low pressure chemical vapor deposition (LPCVD) process using reaction gases including oxygen and nitrogen.

In an implementation, the charge trapping layer 104 may include a high-k material having a dielectric constant k that is higher than that of silicon nitride. Examples of the high-k material may include one or more of metal oxide, metal oxynitride, metal silicon oxide, metal silicon oxynitride, of the like, which may be used alone or in a combination thereof. Examples of metals that may be used for the high-k material may include one or more of hafnium (Hf), zirconium (Zr), tantalum (Ta), lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), lutetium (Lu), or the like, which may be used alone or in a combination thereof. The high-k material may be formed using, e.g., an atomic layer deposition (ALD) process, a chemical vapor deposition (CVD) process, a physical vapor deposition (PVD) process, etc.

The blocking layer 106 may be formed on the charge trapping layer 104. The blocking layer 106 may provide electrical isolation between the charge trapping layer 104 and the conductive layer 108. The blocking layer 106 may include, e.g., aluminum oxide ($Al_2O_3$). The blocking layer 106 may be formed, e.g., to a thickness of about 100 Å to about 400 Å, on the charge trapping layer 104 using, e.g., an ALD process, a CVD process, etc. For example, the blocking layer 106 may be formed to a thickness of about 200 Å on the charge trapping layer 104.

After forming the blocking layer 106, a heat treatment process may be performed to densify the blocking layer 106. The heat treatment process may be performed at a temperature of, e.g., about 850° C. to about 1,200° C., and may be performed under an atmosphere including nitrogen ($N_2$), oxygen ($O_2$), ammonia ($NH_3$), nitrous oxide ($N_2O$), a mixture thereof, etc. For example, the heat treatment process may be performed at a temperature of about 1,080° C. for about 120 seconds using a furnace.

In another implementation, the blocking layer 106 may include a high-k material. Examples of the high-k material may include metal oxide, metal oxynitride, metal silicon oxide, metal silicon oxynitride, and the like, which may be used alone or in a combination thereof. Examples of metals that may be used for the high-k material may include one or more of Hf, Zr, Ta, La, Ce, Pr, Nd, Sm, Eu, Gd, Tb, Dy, Ho, Er, Tm, Yb, Lu, or the like, which may be used alone or in a combination thereof. The high-k material may be formed using, e.g., ALD, CVD, PVD, etc.

The first conductive layer 108 may be formed, e.g., to a thickness of about 100 Å to about 400 Å, on the blocking layer 106. For example, the first conductive layer 108 may be formed to a thickness of about 200 Å using, e.g., ALD, CVD, PVD, etc.

The first conductive layer 108 may include a material having a work function of about 4 eV or more. For example, the conductive layer may include one or more of titanium (Ti), titanium nitride (TiN), Ta, tantalum nitride (TaN), tungsten (W), tungsten nitride (WN), Hf, niobium (Nb), molybdenum (Mo), molybdenum nitride ($MO_2N$), ruthenium oxide (RuO), ruthenium dioxide (RuO$_2$), iridium (Ir), iridium dioxide (IrO$_2$), platinum (Pt), cobalt (Co), chromium (Cr), titanium aluminide (Ti$_3$Al), titanium aluminum nitride (Ti$_2$AlN), palladium (Pd), tungsten silicide (WSi), nickel silicide (NiSi), cobalt silicide (CoSi), tantalum silicide (TaSi), or the like, which may be used alone or in a combination thereof.

A post treatment may be performed to increase the work function of the first conductive layer 108. For example, a heat treatment, a plasma treatment or an ion implantation may be performed after forming the first conductive layer 108. The post treatment may be performed using a process gas including a material different from that of the first conductive layer 108. For example, the post treatment may be performed using a process gas including an of the element corresponding to group II to group VIII of the periodic table. Examples of the elements may include one or more of nitrogen (N), oxygen (O), fluorine (F), neon (Ne), helium (He), phosphorous (P), sulfur (S), chlorine (Cl), argon (Ar), arsenic (As), selenium (Se), bromine (Br), krypton (Kr), antimony (Sb), tellurium (Te), iodine (I), xenon (Xe), or the like, which may be used alone or in combination thereof.

After forming the first conductive layer 108, the barrier layer 110 may be formed on the first conductive layer 108. The barrier layer 110 may reduce variation in the work function of the first conductive layer 108. The thickness of the barrier layer 100 may be less than that of the first conductive layer 108. A thickness ratio of the barrier layer 110 to the first conductive layer 108 may be in a range of, e.g., about 0.3 to about 0.7. For example, when the first conductive layer 108 has a thickness of about 200 Å, the barrier layer 110 may have a thickness of about 100 Å.

The barrier layer 110 may include, e.g., metal silicon nitride. Materials used for the barrier layer 110 may include one or more of titanium silicon nitride (TiSiN), tungsten silicon nitride (WSiN), tantalum silicon nitride (TaSiN), or the like, which may be used alone or in a combination thereof.

The metal silicon nitride may be formed by, e.g., forming a metal silicide layer on the first conductive layer 108 and then nitrifying the metal silicide layer. In another implementation, the metal silicon nitride may be formed by, e.g., forming a metal nitride layer on the first conductive layer 108 and then performing a silicon doping process using a source gas including silicon.

Figure 2:
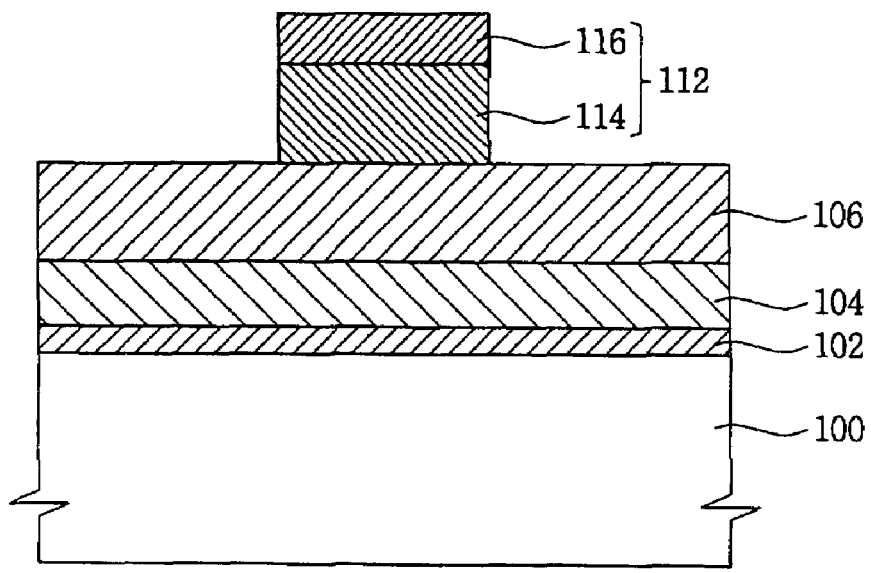

Referring to FIG. 2, a photoresist pattern (not shown) may be formed on the barrier layer 110. The photoresist pattern may be formed by a general photolithography process. Using the photoresist pattern, the barrier layer 100 and the first conductive layer 108 may be patterned to form a control gate electrode 112, including a first conductive layer pattern 114 and a barrier layer pattern 116, on the blocking layer 106. For example, the control gate electrode 112 may be formed by an anisotropic etching process using the photoresist pattern as an etch mask. The photoresist pattern may then be removed, e.g., using an ashing and/or stripping process, after forming the control gate electrode 112.

Figure 3:
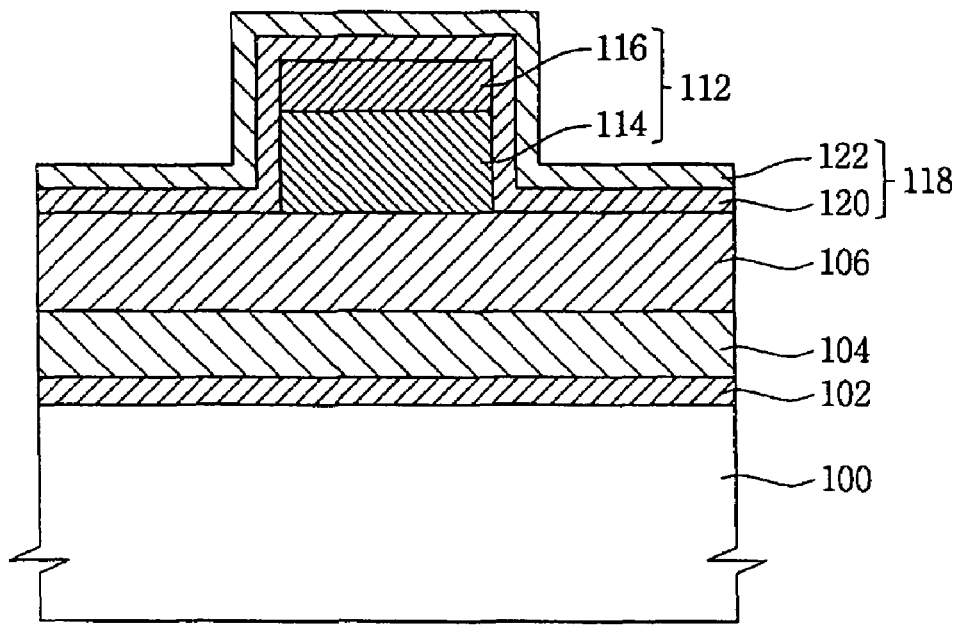

Referring to FIG. 3, a spacer layer 118 may be formed on the control gate electrode 112 and on the blocking layer 106. In an implementation, the spacer layer 118 may include a silicon oxide layer 120 and a silicon nitride layer 122. In detail, the silicon oxide layer 120 may be formed on the control gate electrode 112 and on the blocking layer 106, and the silicon nitride layer 122 may then formed on the silicon oxide layer 120. The silicon oxide layer 120 and the silicon nitride layer 122 may be formed using, e.g., CVD. In another implementation, the silicon oxide layer 120 and the silicon nitride layer 122 may be formed in a same chamber using an in-situ process.

Figure 4:
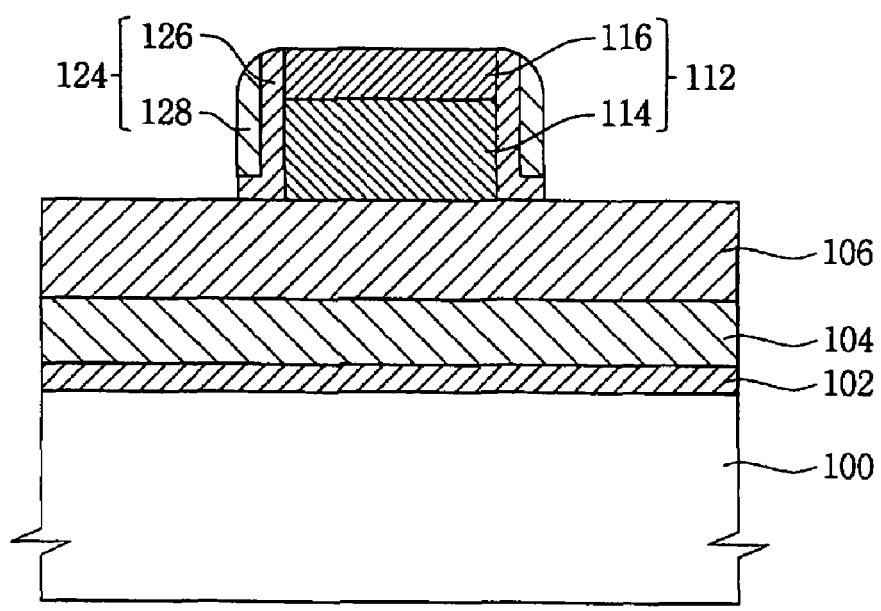

Referring to FIG. 4, a dual spacer 124 may be formed on side surfaces of the control gate electrode 112. The dual spacer 124 may be formed by, e.g., anisotropically etching the spacer layer 118. The dual spacer 124 may include a silicon oxide spacer 126 and a silicon nitride spacer 128. The dual spacer 124 may improve the structural stability of the control gate electrode 112.

In another implementation (not shown), a spacer having a single layer structure may be formed on the side surfaces of the control gate electrode 112. In such case, the spacer may be, e.g., a silicon oxide spacer or a silicon nitride spacer.

Figure 5:
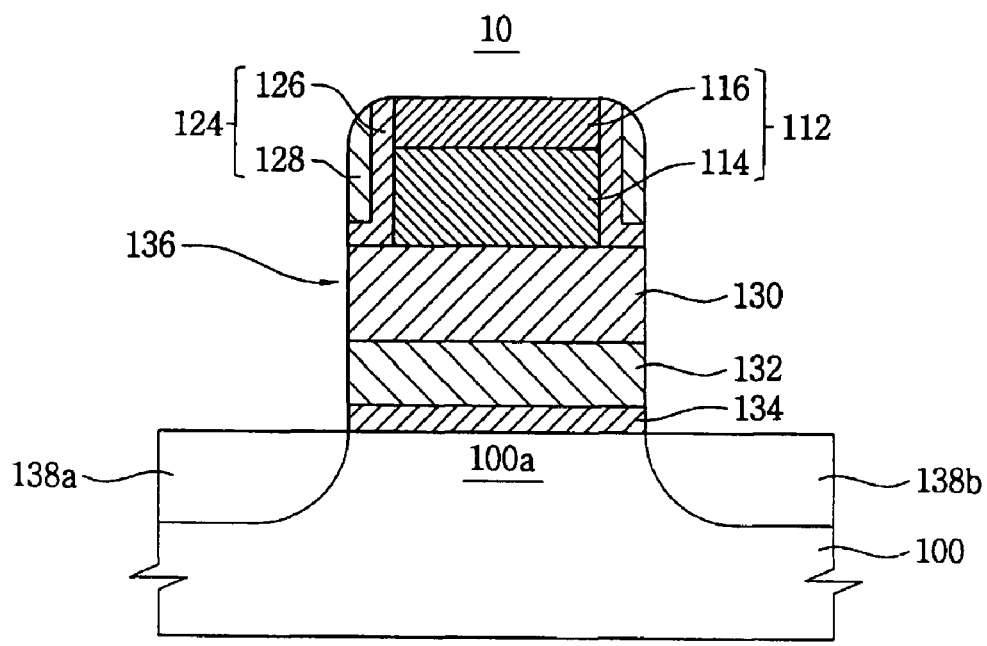

Referring to FIG. 5, a blocking layer pattern 130, a charge trapping layer pattern 132 and a tunnel insulating layer pattern 134 may be formed from the blocking layer 106, the charge trapping layer 104 and the tunnel insulating layer 102, respectively. The blocking layer pattern 130, the charge trapping layer pattern 132 and the tunnel insulating layer pattern 134 may be formed using, e.g., an anisotropic etching process using the control gate electrode 112 and the dual spacer 124 as etch masks.

The above-described processes may produce a gate structure 136 formed on a channel region 100*a* of the semiconductor substrate 100. The gate structure 136 may include the gate electrode 112, the dual spacer 124, the blocking layer pattern 130, the charge trapping layer pattern 132 and the tunnel insulating layer pattern 134.

In an implementation, a re-oxidation process may be performed to cure etch damage to the semiconductor substrate 100 and the gate structure 136.

Source/drain regions 138*a* and 138*b* may be formed in a surface portion of the semiconductor substrate 100 adjacent to the gate structure 136. The source/drain regions 138*a* and 138*b* may be formed using, e.g., an ion implantation process, using the gate structure 136 as an ion implantation mask, and a heat treatment process. The heat treatment process may be performed to electrically activate impurities (dopants) implanted in the surface portion of the semiconductor substrate 100 by the ion implantation process.

During the heat treatment process, material migration in the first conductive layer pattern 114 may be prevented by the barrier layer pattern 116, and outgassing of materials constituting the first conductive layer pattern 114 may be reduced or eliminated. Thus, a variation in the function work of the first conductive layer pattern 114 may be reduced. Consequently, back-tunneling of electrons through the blocking layer pattern 130 in the non-volatile memory device may be reduced. Further, it may take less time to erase stored information from the non-volatile memory device, and data retention characteristic and reliability may be improved in the non-volatile memory device.

Figure 6:
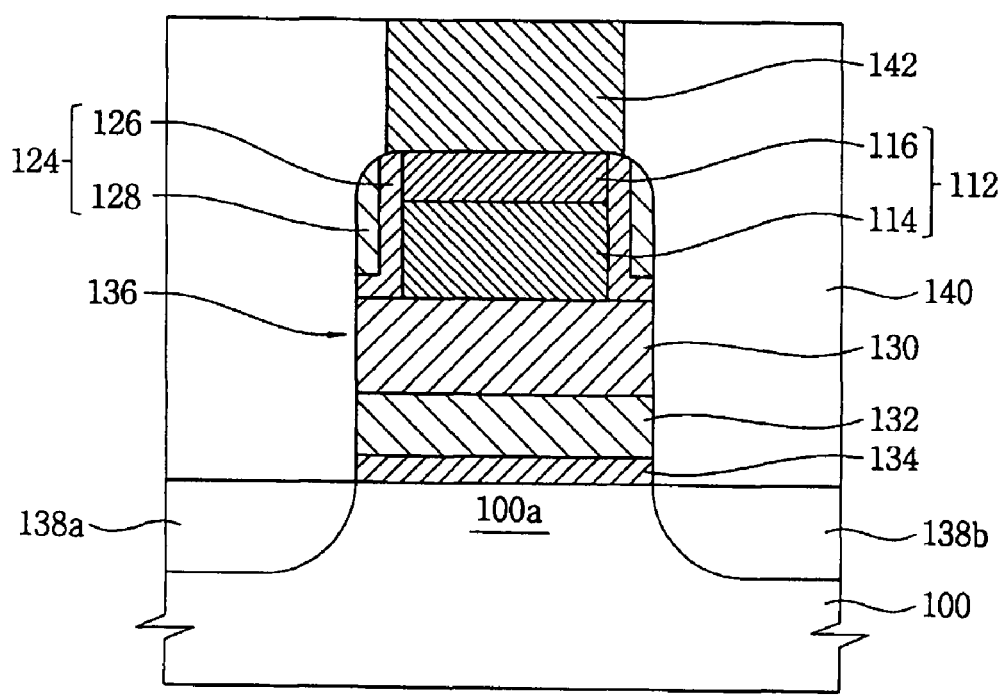

Referring to FIG. 6, an insulating layer 140 may be formed on the gate structure 136 and on the source/drain regions 138*a* and 138*b*. The insulating layer 140 may include, e.g., silicon oxide and may be formed using, e.g., CVD.

In an implementation (not shown), the insulating layer 140 may have a trench exposing the gate electrode 112 and extending along the surface of the semiconductor substrate 100, and a second conductive layer pattern 142 may be formed in the trench to serve as a word line. For example, a photoresist pattern may be formed on the insulating layer 140, and an anisotropic etching process, using the photoresist pattern as an etch mask, may then be performed to form the trench. A second conductive layer may then be formed on the insulating layer 140 and the gate electrode 112 so as to fill up the trench. The second conductive layer may include, e.g., tungsten. The second conductive layer pattern 142 may be formed in the trench by a planarization process. For example, a chemical mechanical polishing (CMP) process may be performed to form the second conductive layer pattern 142 until the insulating layer 140 is exposed.

In another implementation, the second conductive layer may include, e.g., impurity-doped polysilicon or metal silicide such as WSi, CoSi, titanium silicide (TiSi), TaSi, and the like. When the second conductive layer includes impurity-doped polysilicon, an additional heat treatment may be performed to electrically activate the impurities in the second conductive layer. In such case, the material migration in the first conductive layer pattern 114 may again be prevented by the barrier layer pattern 116, and variation in the work function of the gate electrode 112 may be thus reduced. Therefore, back-tunneling of electrons through the blocking layer pattern 130 may be reduced during an erasing operation of the non-volatile memory device 10.

As described above, the second conductive layer pattern 142 serving as the word line may be formed after forming the gate structure 136. In another implementation, the second conductive layer pattern 142 may be formed by first forming and patterning a conductive layer, a barrier layer and another conductive layer on the blocking layer 106.

The non-volatile memory device may serve as a SLC or a MLC, and may perform electrical programming and erasing using F-N tunneling and/or the channel hot electron injection. When the non-volatile memory device serves as a SLC, one bit of data may be stored in the charge trapping layer pattern 132. For example, a logic state of "0" or "1" (i.e., a binary value of "0" or "1") may be stored in the charge trapping layer pattern 132.

In detail, when a programming voltage, e.g., about 5 V to about 18 V, is applied to the control gate electrode 112, electrons may be trapped in the charge trapping layer pattern 132 from the channel region 100a of the semiconductor substrate 100 by F-N tunneling. Accordingly, a logic stage of "1" may be stored in the charge trapping layer pattern 132. A threshold voltage in the channel region 100a may vary in accordance with the logic state stored in the charge trapping layer pattern 132, and the logic state may be read by applying reading voltages to control gate electrode 112 and the drain region 138b, and detecting a current in the channel region 100a.

When the non-volatile memory device serves as a MLC, a logic stage of "00," "01," "10" or "11" may be stored in the charge trapping layer pattern 132. The non-volatile memory device may have threshold voltages different from one another in accordance with the number of electrons trapped in the charge trapping layer pattern 132, and the logic state of the non-volatile memory device may be determined in accordance with the threshold voltages.

Alternatively, electrons may be trapped in the charge trapping layer pattern 132 by the channel hot electron injection mechanism. For example, when the programming voltages are applied to the control gate electrode 112 and the drain region 138b and the source region 138a is grounded, electrons may move from the source region 138a toward the drain region 138 through the channel region 100a. Some of the electrons may have sufficient energy to overcome the potential barrier of the tunnel insulating layer pattern 134, and may be trapped in trap sites of the charge trapping layer pattern 132. Consequently, the threshold voltage of the non-volatile memory device may be increased, and thus data may be stored in the non-volatile memory device.

The erasing operation of the non-volatile memory device may be performed by applying an erasing voltage, e.g., about −15 V to about −20 V, to the gate electrode 112. When the erasing voltage is applied to gate electrode 112, the electrons trapped in the charge trapping layer pattern 132 may move from the charge trapping layer pattern 132 toward the channel region 100a through the tunnel insulating layer pattern 134, thereby erasing the data of the non-volatile memory device.

Particular implementations will now be described in the following experiments in connection with FIG. 7. It will be appreciated that these experiments are merely illustrative and are not to be construed as limiting the present invention thereto. The experiments were performed to determine differences in variation in a work function of a conductive layer formed according to a comparative method and a work function of conductive layer with a barrier layer formed according to example embodiments.

In a first comparative experiment, a titanium nitride layer was formed to a thickness of about 200 Å on a semiconductor substrate on which an insulating layer had been formed, and a flat band voltage of the titanium nitride layer was then measured. The flat band voltage is proportional to the work function in the titanium nitride layer.

Figure 7:
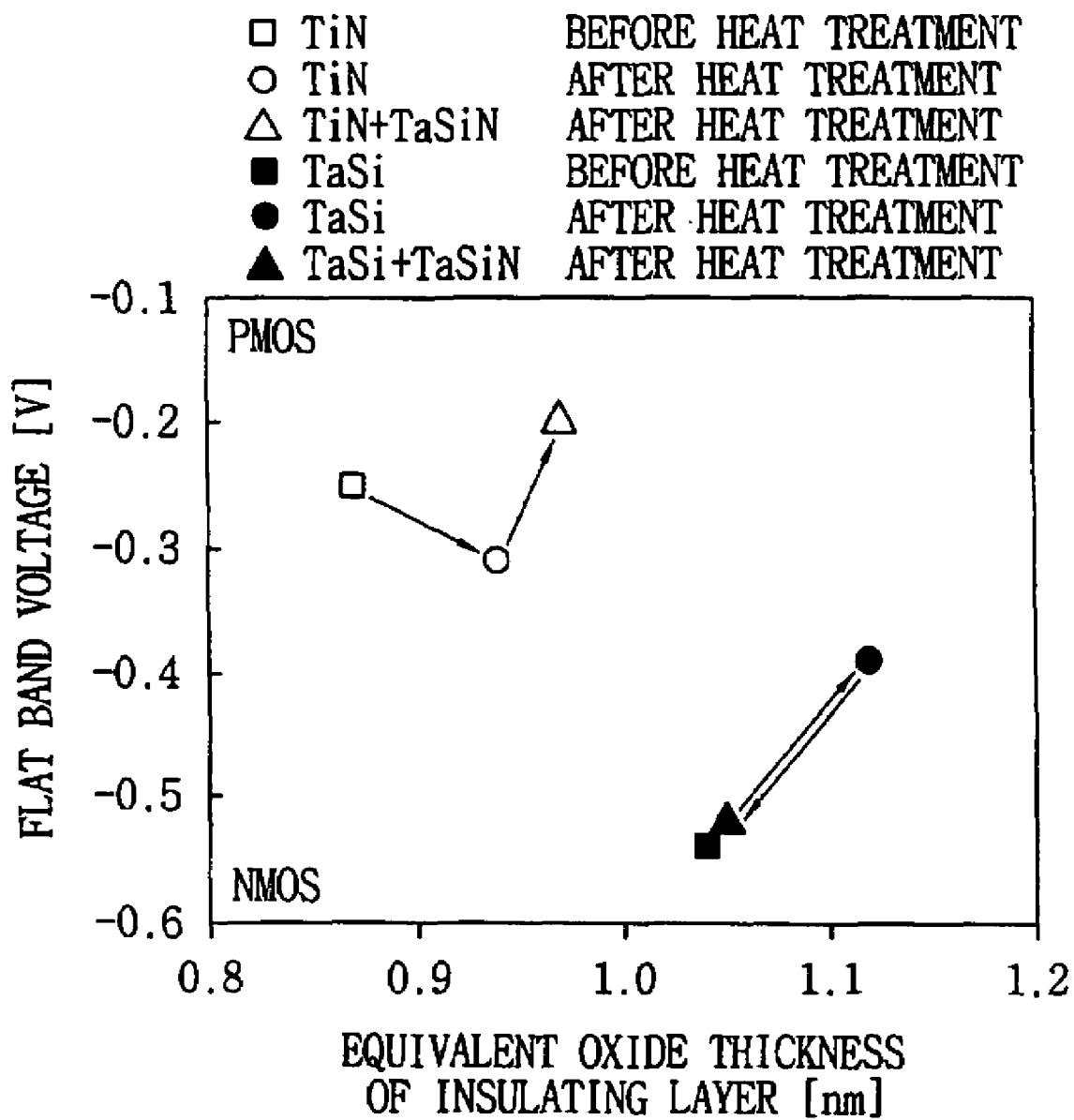
FIG. 7 illustrates a graph of a flat band voltage of a conductive layer formed on an insulating layer in a non-volatile memory device according to an example embodiment.

Referring to FIG. 7, the measured flat band voltage of the titanium nitride layer was about −0.25 V. However, after heat treating the titanium nitride layer at a temperature of about 1,000° C., the flat band voltage of the titanium nitride layer was reduced to about −0.31 V. Thus, the work function of the titanium nitride layer was reduced by the heat treatment.

In a first experiment according to an example embodiment, a titanium nitride layer and a tantalum silicon nitride layer were formed on a semiconductor substrate on which an insulating layer had been formed. The titanium nitride layer was formed to a thickness of about 200 Å on the insulating layer, and the tantalum silicon nitride layer was then formed to a thickness of about 100 Å on the titanium nitride layer. Then, the titanium nitride layer and the tantalum silicon nitride layer were heat treated at a temperature of about 1,000° C.

Referring to FIG. 7, a flat band voltage of the titanium nitride layer and the tantalum silicon nitride layer was measured at about −0.18 V. Thus, the lowering of the work function of the titanium nitride layer during the heat treatment was reduced by the tantalum silicon nitride layer.

In a second comparative experiment, a tantalum silicide layer was formed to a thickness of about 200 Å on a semiconductor substrate on which an insulating layer had been formed, and a flat band voltage of the tantalum silicide layer was then measured.

Referring to FIG. 7, the measured flat band voltage of the tantalum silicide layer was about −0.54 V. However, after heat treating the tantalum silicide layer at a temperature of about 1,000° C., the flat band voltage of the tantalum silicide layer was increased to about −0.38 V. Thus, the work function of the tantalum silicide layer was increased by the heat treatment.

In a second experiment according to an example embodiment, a tantalum silicide layer and a tantalum silicon nitride layer were formed on a semiconductor substrate on which an insulating layer had been formed. The tantalum silicide layer was formed to a thickness of about 200 Å on the insulating layer, and the tantalum silicon nitride layer was then formed to a thickness of about 100 Å on the tantalum silicide layer. Then, the tantalum silicide layer and the tantalum silicon nitride layer were heat treated at a temperature of about 1,000° C.

Referring to FIG. 7, a flat band voltage of the tantalum silicide layer and the tantalum silicon nitride layer was measured at about −0.52 V. Thus, the variation in the work function of the tantalum silicide layer was reduced by the tantalum silicon nitride layer during the heat treatment.

As described above, a gate electrode of a non-volatile memory device may include a conductive layer pattern including a metallic material, e.g., having a work function of about 4 eV or more, and a barrier layer pattern which may reduce variation in the work function of the conductive layer pattern. Thus, back-tunneling of electrons through a blocking layer pattern may be reduced, and a time required for erasing stored information from the non-volatile memory device may be shortened. Further, the data retention characteristic and reliability of the non-volatile memory device may be improved.

As used herein, it will be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present.

As used herein, the expressions "at least one," "one or more," and "and/or" are open-ended expressions that are both conjunctive and disjunctive in operation. For example, each of the expressions "at least one of A, B, and C," "at least one of A, B, or C," "one or more of A, B, and C," "one or more of A, B, or C" and "A, B, and/or C" includes the following meanings: A alone; B alone; C alone; both A and B together; both A and C together; both B and C together; and all three of A, B, and C together. Further, these expressions are open-ended, unless expressly designated to the contrary by their combination with the term "consisting of." For example, the expression "at least one of A, B, and C" may also include an nth member, where n is greater than 3, whereas the expression "at least one selected from the group consisting of A, B, and C" does not.

As used herein, the expression "or" is not an "exclusive or" unless it is used in conjunction with the term "either." For example, the expression "A, B, or C" includes A alone; B alone; C alone; both A and B together; both A and C together; both B and C together; and all three of A, B and, C together, whereas the expression "either A, B, or C" means one of A alone, B alone, and C alone, and does not mean any of both A and B It will be understood that, although the terms "first," "second," etc., may be used herein to describe various elements, these elements are not limited by these terms, which are only used to distinguish one element from another. For example, a first thin film could be termed a second thin film and, similarly, a second thin film could be termed a first thin film.

As used herein, the singular forms "a," "an" and "the" are intended to include the plural forms as well, unless the context clearly indicates otherwise. It will be further understood that the terms "comprises" and/or "comprising," or "includes" and/or "including" specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to other elements as illustrated in the figures. It will be understood that such relative terms are intended to encompass different orientations of the device in addition to the orientation depicted in the figures. For example, if the device in one of the figures is turned over, elements described as being on the "lower" side of other elements would then be oriented on "upper" sides of the other elements. The term "lower" can, therefore, encompass both an orientation of "lower" and "upper," depending on the particular orientation of the figure. Similarly, if the device in one of the figures is turned over, elements described as "below" or "beneath" other elements would then be oriented "above" the other elements. The terms "below" or "beneath" can, therefore, encompass both an orientation of above and below.

Unless otherwise defined, all terms (including technical and scientific terms) used herein have the same meaning as commonly understood by one of ordinary skill in the art. It will be further understood that terms, such as those defined in commonly used dictionaries, should be interpreted as having a meaning that is consistent with their meaning in the context of the relevant art and the present disclosure, and should not be interpreted in an idealized or overly formal sense unless expressly so defined herein.

Example embodiments may be described herein with reference to cross section illustrations that are schematic illustrations of idealized embodiments. As such, variations from the shapes of the illustrations, as a result, for example, of manufacturing techniques and/or tolerances, are to be expected. Thus, illustrated embodiments should not be construed as limited to the particular shapes of regions illustrated herein, and are to include deviations in shapes that result, for example, from manufacturing. For example, a region illustrated or described as flat may have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present invention.

Example embodiments of the present invention have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A non-volatile memory device, comprising:
    a tunnel insulating layer pattern on a channel region of a substrate;
    a charge trapping layer pattern on the tunnel insulating layer pattern;
    a blocking layer pattern on the charge trapping layer pattern; and
    a gate electrode including a conductive layer pattern on the blocking layer pattern and a barrier layer pattern on the conductive layer pattern, wherein the conductive layer pattern includes a metal having a work function of about 4 eV or more, and the barrier layer pattern includes metal silicon nitride so as to reduce variation in the work function of the conductive layer pattern when a heat treatment process is performed.

2. The non-volatile memory device as claimed in claim 1, wherein the barrier layer pattern includes one or more of titanium silicon nitride, tungsten silicon nitride, or tantalum silicon nitride.

3. The non-volatile memory device as claimed in claim 1, wherein the conductive layer pattern includes one or more of titanium, titanium nitride, tantalum, tantalum nitride, tungsten, tungsten nitride, hafnium, niobium, molybdenum, molybdenum nitride, ruthenium oxide, ruthenium dioxide, iridium, iridium dioxide, platinum, cobalt, chromium, titanium aluminide, titanium aluminum nitride, palladium, tungsten silicide, nickel silicide, cobalt silicide, or tantalum silicide.

4. The non-volatile memory device as claimed in claim 3, further comprising source/drain regions in the substrate adjacent to the channel region.

5. The non-volatile memory device as claimed in claim 4, wherein the source/drain regions are activated impurity regions.

6. The non-volatile memory device as claimed in claim 3, further comprising a word line disposed on the gate electrode, wherein the word line includes polysilicon containing activated impurities.

7. The non-volatile memory device as claimed in claim 1, wherein a thickness of the barrier layer pattern is less than that of the conductive layer pattern.

8. The non-volatile memory device as claimed in claim 7, wherein a thickness ratio of the barrier layer pattern to the conductive layer pattern is about 3:10 to about 7:10.

9. A method of manufacturing a non-volatile memory device, comprising:

forming a tunnel insulating layer pattern on a channel region of a substrate;

forming a charge trapping layer pattern on the tunnel insulating layer;

forming a blocking layer pattern on the charge trapping layer; and forming a gate electrode including a conductive layer pattern on the blocking layer pattern and a barrier layer pattern on the conductive layer pattern, wherein the conductive layer pattern includes a metal having a work function of about 4 eV or more, and the barrier layer pattern includes metal silicon nitride so as to reduce variation in the work function of the conductive layer pattern when a heat treatment process is performed.

10. The method as claimed in claim 9, wherein the barrier layer pattern includes one or more of titanium silicon nitride, tungsten silicon nitride, or tantalum silicon nitride.

11. The method as claimed in claim 9, wherein the conductive layer pattern includes one or more of titanium, titanium nitride, tantalum, tantalum nitride, tungsten, tungsten nitride, hafnium, niobium, molybdenum, molybdenum nitride, ruthenium oxide, ruthenium dioxide, iridium, iridium dioxide, platinum, cobalt, chromium, titanium aluminide, titanium aluminum nitride, palladium, tungsten silicide, nickel silicide, cobalt silicide, or tantalum silicide.

12. The method as claimed in claim 11, further comprising forming source/drain regions in the substrate adjacent to the channel region.

13. The method as claimed in claim 12, wherein forming the source/drain regions includes activating impurity regions using a heat treatment.

14. The method as claimed in claim 11, further comprising forming a word line on the gate electrode, wherein forming the word line includes implanting impurities in a polysilicon layer and heat treating the implanted polysilicon layer.

15. The method as claimed in claim 9, wherein a thickness of the barrier layer pattern is less than that of the conductive layer pattern.

16. The method as claimed in claim 15, wherein a thickness ratio of the barrier layer pattern to the conductive layer pattern is about 3:10 to about 7:10.

* * * * *